(12) United States Patent
Sugiyama et al.

(10) Patent No.: US 6,675,930 B2
(45) Date of Patent: Jan. 13, 2004

(54) SPEAKER HOLDER

(75) Inventors: Shigeru Sugiyama, Shizuoka (JP); Hajime Kitamura, Shizuoka (JP); Yoshio Imahori, Shizuoka (JP)

(73) Assignee: Star Micronics Co., Ltd., Shizuoka (JP)

( * ) Notice: Subject to any disclaimer, the term of this patent is extended or adjusted under 35 U.S.C. 154(b) by 0 days.

(21) Appl. No.: 10/103,850

(22) Filed: Mar. 25, 2002

(65) Prior Publication Data

US 2002/0139608 A1 Oct. 3, 2002

(30) Foreign Application Priority Data

Mar. 27, 2001 (JP) ........................................ 2001-089173

(51) Int. Cl.[7] ................................................ H05K 5/00
(52) U.S. Cl. .................... 181/148; 181/150; 181/199; 181/153
(58) Field of Search ................................ 181/148, 150, 181/153, 198, 199; 381/300, 304, 305

(56) References Cited

U.S. PATENT DOCUMENTS

| | | | | |
|---|---|---|---|---|
| 3,835,256 A | * | 9/1974 | Wieder | 381/341 |
| 3,892,930 A | * | 7/1975 | Wieder | 340/629 |
| 4,359,133 A | * | 11/1982 | Krolak | 181/172 |
| 4,439,643 A | * | 3/1984 | Schweizer | 381/395 |
| 4,823,110 A | * | 4/1989 | Dorward et al. | 340/391.1 |
| 4,845,760 A | * | 7/1989 | Awakowicz et al. | 381/392 |
| 5,218,337 A | * | 6/1993 | Peter | 340/388.1 |
| 5,416,283 A | * | 5/1995 | Dault et al. | 181/150 |
| 5,952,619 A | * | 9/1999 | Kantor et al. | 181/150 |
| 6,427,019 B1 | * | 7/2002 | Ketterer et al. | 381/386 |
| 6,526,150 B2 | * | 2/2003 | Kelly et al. | 381/353 |
| 2001/0045320 A1 | * | 11/2001 | Sugiyama et al. | 181/153 |
| 2002/0150271 A1 | * | 10/2002 | Sugiyama et al. | 381/386 |

FOREIGN PATENT DOCUMENTS

| | | | | |
|---|---|---|---|---|
| JP | 06178390 A | * | 6/1994 | H04R/9/04 |
| JP | 08079348 A | * | 3/1996 | H04M/1/03 |

* cited by examiner

Primary Examiner—Robert Nappi
Assistant Examiner—Patrick Miller
(74) Attorney, Agent, or Firm—Sughrue Mion, PLLC

(57) ABSTRACT

A speaker holder includes a speaker engagement portion (52) abutting the bottomed cylindrical portion (26A) of the frame (26) of the speaker (10) and a plurality of engagement legs (54) extending from the speaker engagement portion (52). The speaker (10) is disposed tightly between the speaker engagement portion (52) and the printed circuit board (2) and fixed thereto via the engagement legs (54).

12 Claims, 8 Drawing Sheets

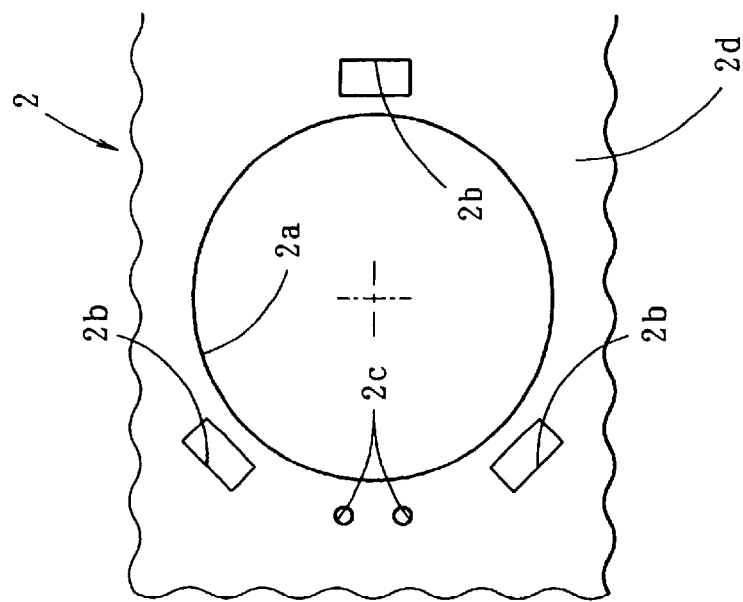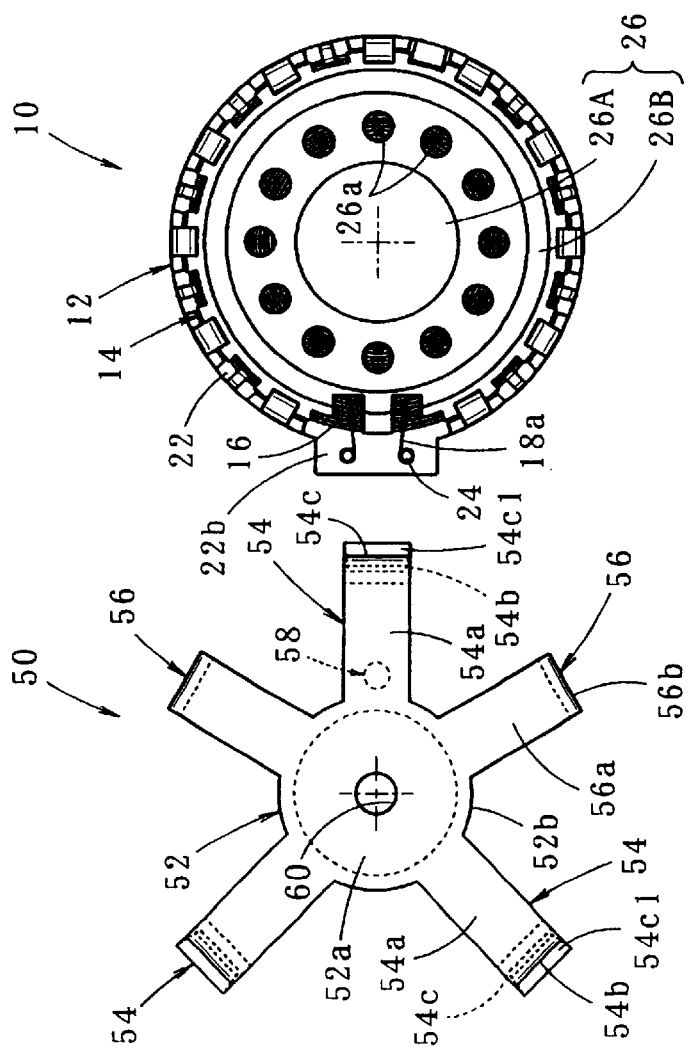

SPEAKER HOLDER

BACKGROUND OF THE INVENTION

1. Field of the Invention

The present invention relates to a speaker holder for a speaker to be mounted on a printed circuit board.

2. Description of the Related Art

A dynamic speaker is conventionally known among the types of a speaker. As shown in JP-A-6-178390, a dynamic speaker comprises a diaphragm having a voice coil attached on the back surface, and a magnetic circuit structure disposed on the back side of the diaphragm and adapted to support the diaphragm at the periphery thereof.

As shown in FIG. 8, an insulating ring 122 is attached to the front surface of a diaphragm 116 at the periphery thereof and thereby the diaphragm 116 is easily supported by a magnetic circuit frame 114. A pair of terminal members 124 are supported by the insulating ring 122, and thereby a pair of lead wires 118a drawn from a voice coil 118 are connected or fixed to the pair of terminal members 124.

Conventionally, a speaker 110 is first assembled in a holder 150 and then the holder 150 is fixed to a printed circuit board 102. The speaker 110 is housed in the holder 150 with the front side of the speaker 110 facing in the opposite direction to the printed circuit board 102. The holder 150, as shown in FIG. 8, comprises a holder body 152 and a cover 154. The speaker 110 is put tightly therebetween, and then the holder body 152 and the cover 154 are bonded.

The conventional holder has a disadvantage in that the height of the holder 150 when the speaker 110 is mounted on the printed circuit board 102 via the holder 150 is considerably high since the holder 150 has separate independent structures for retaining the speaker 110 and for fixing the holder 150 to the printed circuit board 102.

The conventional holder has another disadvantage in that the holder 150 has a complex structure since it has such separate sub-structures.

SUMMARY OF THE INVENTION

An object of the present invention is to provide a speaker holder having a simple structure and a lower mounting height on a printed circuit board.

The speaker holder of the present invention achieves the object by providing a single structure adapted for both retaining the speaker and for fixing the holder to the printed circuit board.

According to an aspect of the present invention, there is provided a speaker holder for a speaker to be mounted on a printed circuit board comprising:

a speaker engagement portion abutting the back surface of the speaker; and at least one leg extending from the speaker engagement portion;

wherein the speaker is fixed on the printed circuit board via the at least one leg of the speaker holder with the speaker put tightly between the speaker engagement portion and the printed circuit board.

The leg is not limited to the one as herein described. As far as it extends from the speaker engagement portion and is adapted for fixation on the printed circuit board, any type of the leg is applicable to the present invention regardless of the shape, the number and the arrangement.

The method of fixation is not limited to the one as herein described. Any method is applicable such as engagement, screw, and adhesive bonding.

Compared with the conventional holder having separate structures for retaining the speaker and for fixation on the printed circuit board, the mounting height of the holder when the speaker is mounted on the printed circuit board via the holder is considerably decreased in the present invention.

Further, the holder is of a simple structure since a separate structure for supporting the speaker as in the conventional art is never required.

A plurality of legs may be provided radially extending from the speaker engagement portion to stably fix the speaker on the printed circuit board.

An end of the leg may be engaged with an engaging hole formed in the printed circuit board to further facilitate the mounting and fixing operation of the speaker on the printed circuit board.

The leg may be deflected in state where the speaker is mounted on the printed circuit board so that the speaker engagement portion constantly exerts elastic pressure on the speaker to strengthen fixation of the speaker and the printed circuit board.

The speaker engagement portion may be adapted to fit into the back surface of the speaker to radially position the speaker precisely on the printed circuit board.

The leg may have a positioning portion adapted to engage with the speaker to circumferentially position the speaker precisely on the printed circuit board.

The positioning portion may be any means as far as the purpose is fulfilled. It may be a positioning pin adapted to be inserted into a sound emitting hole formed in the speaker.

BRIEF DESCRIPTION OF THE DRAWINGS

FIG. 5 is an exploded top plan view of the speaker mounted on the printed circuit board by the speaker holder of the present invention.

DETAILED DESCRIPTION OF THE INVENTION

The present invention will be described below in detail with reference to the accompanying drawings.

Figure 1:
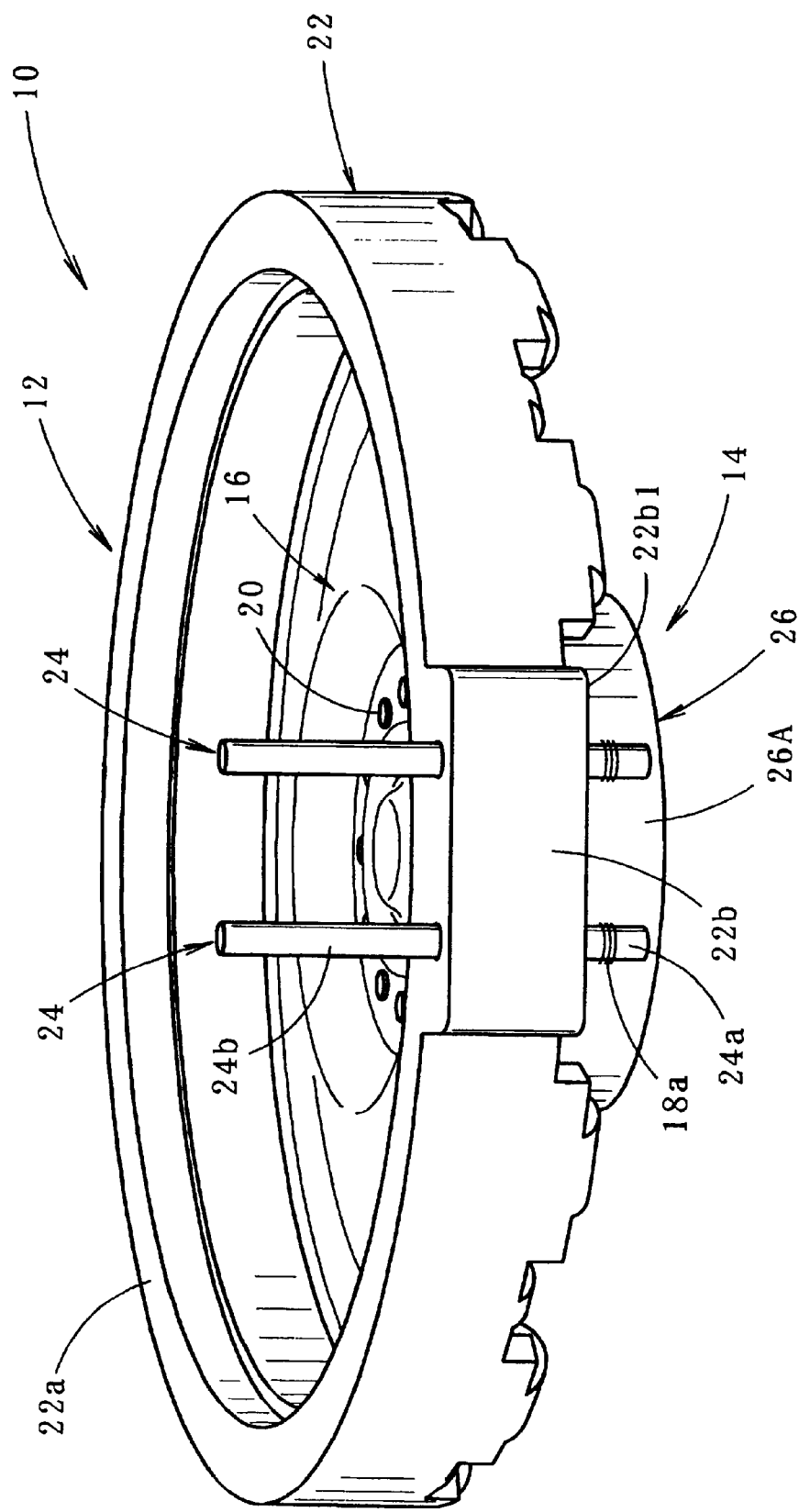
FIG. 1 is a perspective view of a speaker which is to be retained by a speaker holder of the present invention.

FIG. 1 is a perspective view of a speaker 10 which is to be retained by a speaker holder 50 of the present invention.

Figure 2:
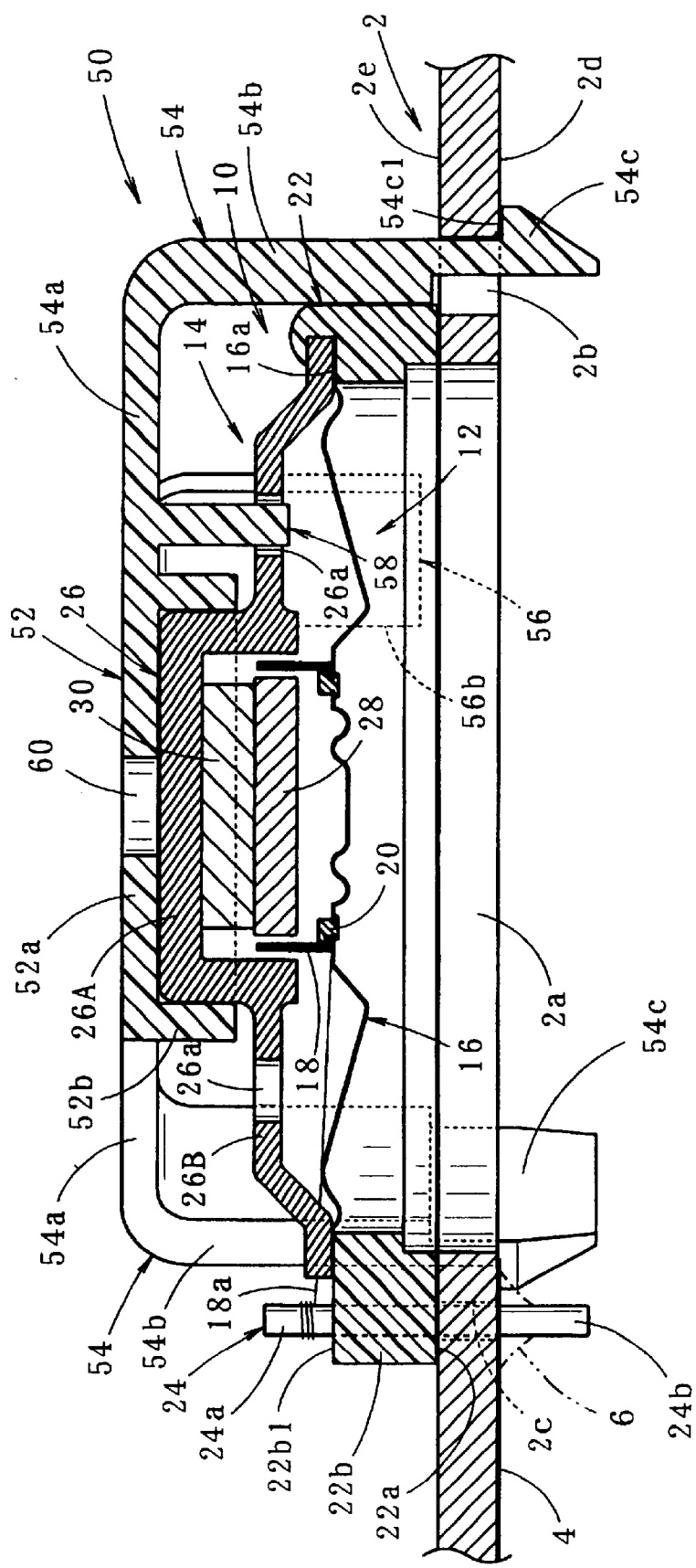
FIG. 2 is a side sectional view of the speaker mounted on a printed circuit board by the speaker holder of the present invention.
Figure 3:
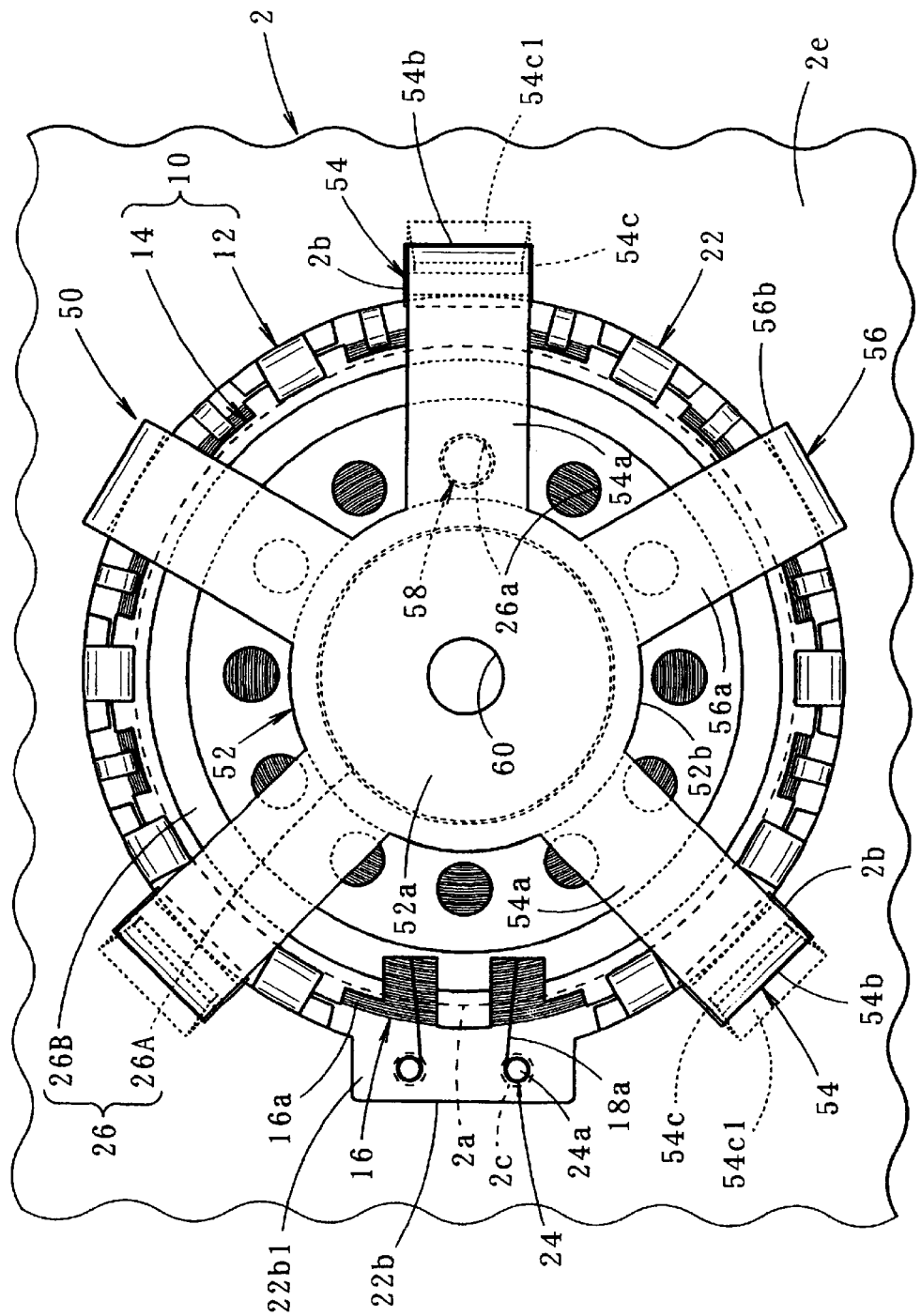
FIG. 3 is a top plan view of the speaker mounted on the printed circuit board by the speaker holder of the present invention.

FIGS. 2 and 3 are a side sectional view and a top plan view respectively showing the speaker 10 mounted on a printed circuit board 2 by the speaker holder 50 of the present invention in which the front side of the speaker 10 is opposed to the printed circuit board 2.

As shown in these drawings, the speaker 10 is a small dynamic speaker (of an outer diameter of approx. 30 mm) which is mounted on the printed circuit board 2 together with other electronic components (not shown). The printed circuit board 2 is installed in, for example, a front instrument board in an automobile, and the speaker 10 is used as a sounding means for an alarm. The speaker 10 is fixed on the printed circuit board 2 via a speaker holder 50.

Figure 4:
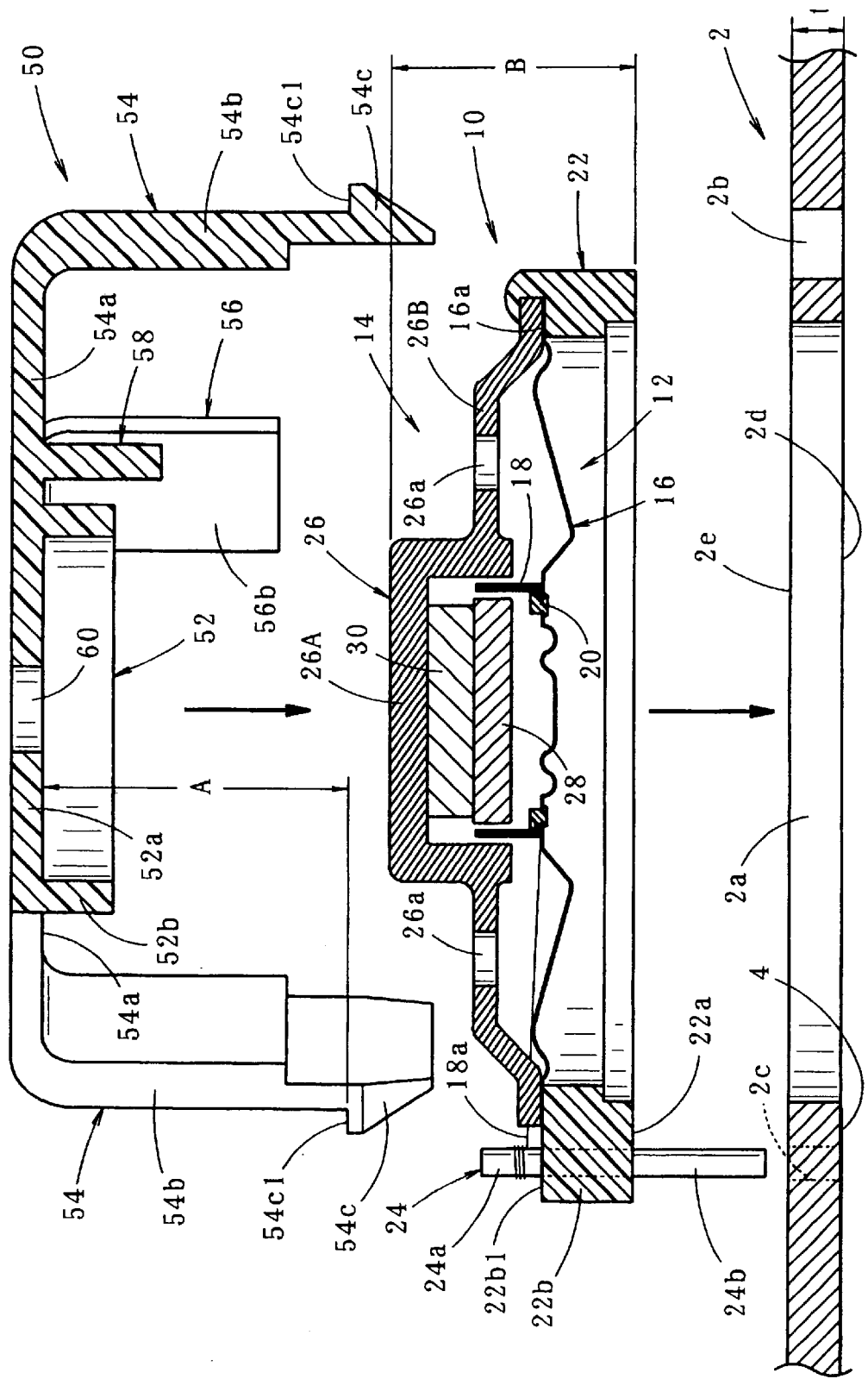
FIG. 4 is an exploded side sectional view of the speaker mounted on the printed circuit board by the speaker holder of the present invention.

FIGS. 4 and 5 are an exploded side sectional view and an exploded top plan view respectively showing the speaker 10 mounted on the printed circuit board 2 via the speaker holder 50.

As shown in these drawings, the speaker 10 comprises a diaphragm subassembly 12 and a magnetic circuit frame 14.

The diaphragm subassembly 12 comprises a diaphragm 16 having a circular periphery 16a, a voice coil 18 fixed on the back surface of the diaphragm 16 by a coil supporting member 20, an insulating ring 22 fixed on the front surface of the periphery 16a of the diaphragm 16, and a pair of terminal pins 24.

The insulating ring 22 is made of synthetic resin extending along the circumference of the diaphragm 16 and caulked thereto at a plurality of positions on the back end of the insulating ring 22. The front end of the insulating ring 22 is an annular flat surface 22a. An extended portion 22b of a predetermined width is formed on the periphery of the insulating ring 22 so as to radially extend outward. The pair of terminal pins 24 are supported by the extended portion 22b with a predetermined interval kept between the terminal pins.

The pair of terminal pins 24 are metal pins penetrating straight the extended portion 22b back and forth, and fixed thereto by insert molding. A pair of lead wires 18a drawn from the voice coil 18 are wound on the pair of the terminal pins 24 respectively. The lead wires 18a are thereby connected to a conductor (conductor pattern) 4 of the printed circuit board 2 for continuity. Each of the terminal pins 24 comprises a lead wire fixing portion 24a and a conducting portion 24b. The lead wire fixing portion 24a projects backward from the back surface 22b1 of the extended portion 22b. The conducting portion 24b projects forward from the annular flat surface 22a of the insulating ring 22.

The magnetic circuit frame 14 comprises a frame 26 of rigid material, a magnet 30, and a yoke 28 of rigid material.

The frame 26 comprises a bottomed cylindrical portion 26A and an annular mounting portion 26B. The bottomed cylindrical portion 26A projects backward at the center of the speaker 10. The annular mounting portion 26B projects radially outward from the vicinity of the front end of the bottomed cylindrical portion 26A. The mounting portion 26B has an outer diameter substantially equal to that of the diaphragm 16. An annular flat portion is formed on the circumference of the mounting portion 26B. A plurality of sound emitting holes 26a are circumferentially provided on the mounting portion 26B at predetermined intervals to each other.

The magnet 30 and the yoke 28 are formed in the shape of a disk respectively. They are located in this order in the bottomed cylindrical portion 26A so as to be concentric to each other, and bonded to the frame 26. A cylindrical gap is formed between the outer surface of the yoke 28 and the inner surface of the bottomed cylindrical portion 26A having the same width over the entire circumference so as to accommodate a rear portion of the voice coil 18 in the gap.

The magnetic frame 14 is assembled with the diaphragm subassembly 12 by caulking the insulating ring 22 onto the frame 26. Specifically, the back end of the insulating ring 22 is caulked onto the front end of the annular flat portion of the mounting portion 26B of the frame 26 at a plurality of circumferential spots.

The structure of the speaker holder 50 will be explained below.

Figure 6:
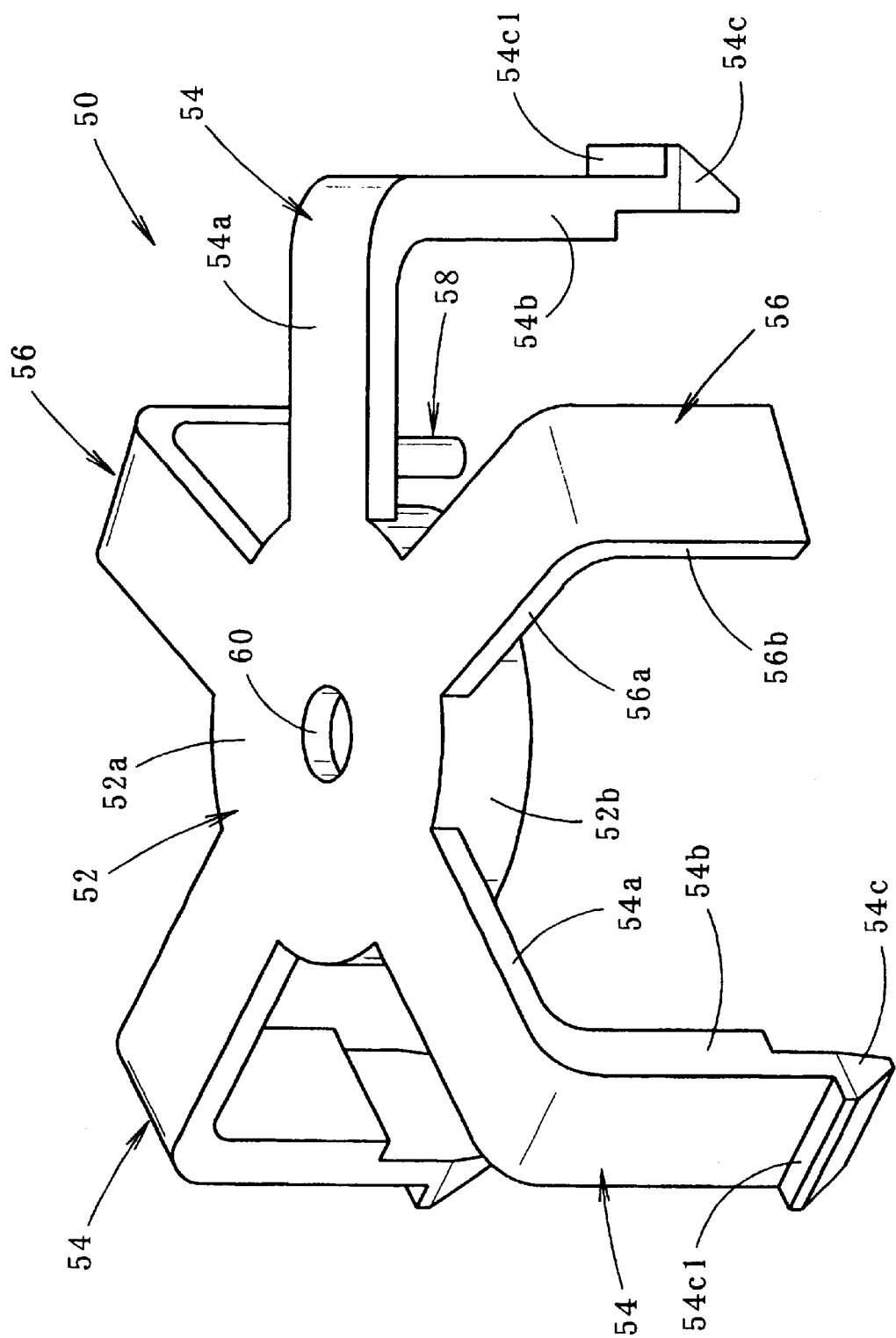
FIG. 6 is a perspective view of the speaker holder of the present invention.

FIG. 6 is a perspective view of the speaker holder 50.

As shown in this drawing, the speaker holder 50 comprises a speaker engagement portion 52 at the center, three engagement legs 52 and two dummy legs 56 radially extending from the speaker engagement portion 52, and a positioning pin 58 formed on one of the engagement legs 52.

The speaker engagement portion 52 comprises a bottom portion 52a having an opening 60 at the center and a cylindrical portion 52b of a small height extending from the bottom portion 52a. The bottom portion 52a abuts the back surface of the bottomed cylindrical portion 26A of the frame 26 of the speaker 10. The speaker 10 is radially positioned by the cylindrical portion 52b which is adapted to be engaged with the cylindrical side surface of the bottomed cylindrical portion 26A.

Two of the engagement legs 54 are disposed at an angle of 135 degrees respectively with respect to the other of the engagement leg 54. The dummy legs 56 are disposed at an angle of 60 degrees respectively with respect to the other of the engagement leg 54.

Each of the engagement legs 54 has the shape of substantially a letter of "L". Each of the engagement legs 54 comprises a horizontal portion 54a radially extending outward from the bottom portion 52a, a vertical portion 54b vertically extending from the end of the horizontal portion 54a along the direction the cylindrical portion 52b extends, and a lance portion 54c formed at the end of the vertical portion 54b.

The vertical portion 54b is relatively thick compared with the horizontal portion 54a and a base part of the lance portion 54c at the end of the vertical portion 54b. Therefore, the rigidity of the vertical portion 54b is higher compared with that of the horizontal portion 54a or that of the base part of the lance portion 54c. Since the thickness is different between the vertical portion 54b and the base part of the lance portion 54c, there is formed a stepped portion at the inner surface of the end of the vertical portion 54b. The lance portion 54c has an engaging surface 54c1 at the side of the outer surface of the vertical portion 54b.

Each of the dummy legs 56 has also the shape of substantially a letter of "L". Each of the dummy legs 56 comprises a horizontal portion 56a radially extending from the bottom portion 52a and a vertical portion 56b extending from the end of the horizontal portion 56a along the direction the cylindrical portion 52b extends. The thickness of the vertical portion 56b is substantially equal to that of the horizontal portion 56a.

The positioning pin 58 is formed so as to protrude from the horizontal portion 54a of one of the engagement legs 54 along the direction the cylindrical portion 52b extends. The positioning pin 58 is disposed opposed to one of the sound emitting holes 26a, having an adequate length so that the front end of the positioning pin 58 is inserted into the sound emitting hole 26a when the bottom portion 52a of the holder 50 is brought to an engagement with the bottomed cylindrical portion 26A of the speaker 10.

As shown in FIG. 4, the dimension "A" between the inner surface (front surface) of the bottom portion 52a of the speaker engagement portion 52 and the engaging surface 54c1 of each of the lance portions 54c is set a smaller value than the sum of the dimension "B" and the dimension "t" where "B" is the dimension between the outer surface (back surface) of the bottomed cylindrical portion 26A and the annular flat surface 22a of the insulating ring 22, and "t" is the thickness of the printed circuit board 2.

The structure of the printed circuit board 2 will be described below.

As shown in FIG. 5(c), the printed circuit board 2 has a circular opening 2a of substantially equal diameter to the inner diameter of the insulating ring 22 so as to oppose the diaphragm 16 of the speaker 10. There are formed three rectangular engaging holes 2b and two circular pin holes 2c so as to surround the circular opening 2a. Each of the rectangular engaging holes 2b is opposed to each of the lance portions 54c of the holder 50, and each of the pin holes 2c is opposed to each of the terminal pins 24 of the speaker 10.

As shown in FIG. 4, the conductor 4 is extended to surround each of the pin holes 2c on the front surface 2d (the opposite surface to the speaker mounting surface) of the printed circuit board 2.

When the speaker 10 is mounted on the printed circuit board 2, the speaker 10 may be first mounted on the printed circuit board 2 and then the holder 50 may be fixed to the printed circuit board 2. Alternatively, the speaker 10 may be first set in the holder 50 and then the holder 50 retaining the speaker 10 therein may be fixed to the printed circuit board 2.

The latter method of operation will be described below.

The speaker 10 is set in the holder 50 by engagement of the speaker engagement portion 52 of the holder 50 with the bottomed cylindrical portion 26A of the frame 26 of the speaker 10. The holder 50 and the speaker 10 are circumferentially positioned by inserting the positioning pin 58 of the holder 50 into one of the sound emitting hole 26a of the speaker 10.

The holder 50 retaining the speaker 10 is then mounted on the printed circuit board 2 with the annular flat surface 22a of the insulating ring 22 abutting against the back surface 2e of the printed circuit board 2. This is achieved by inserting each of the terminal pins 24 of the speaker 10 into each of the pin holes 2c of the printed circuit board 2, and further by inserting each of the lance portions 54c of the holder 50 into each of the engaging holes 2b of the printed circuit board 2.

The above-mentioned insertion will be described. Each of the lance portion 54c firstly interferes with the outer edge of each of the rectangular engaging holes 2b. The base part of the lance portion 54c of relatively low rigidity is likely bent inward, and the horizontal portion 54a of the engagement leg 54 of relatively low rigidity is likely bent backward by a vertical reaction force that the lance portion 54c receives from the outer edge of the engaging hole 2b. The deflected horizontal portion 54a is pressed forward by an operator, thereby each of the lance portions 54c gets over the outer edge of each of the engaging holes 2b for engagement.

Figure 7:
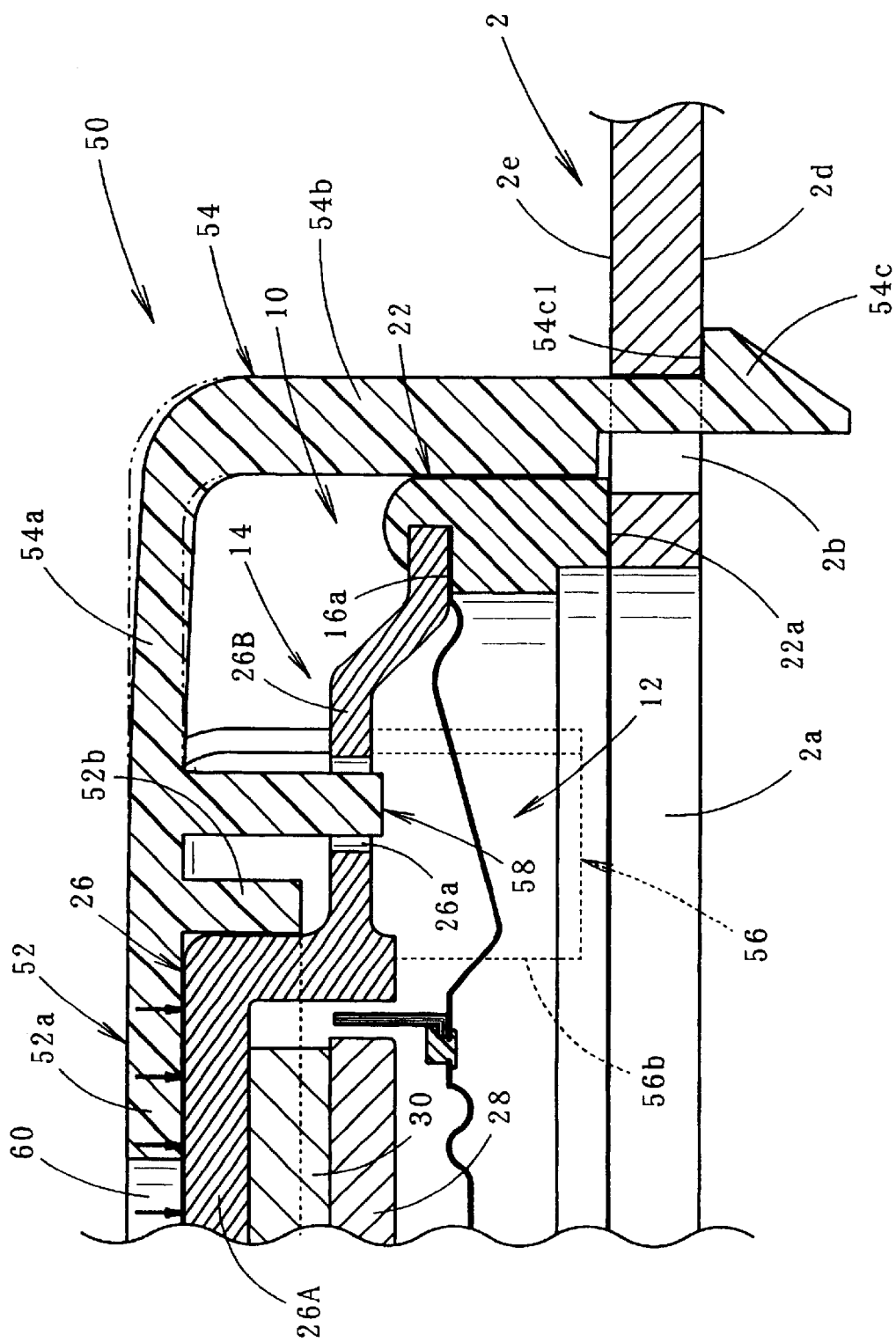
FIG. 7 is a partial side sectional view showing the operation of the speaker holder.
Figure 8:
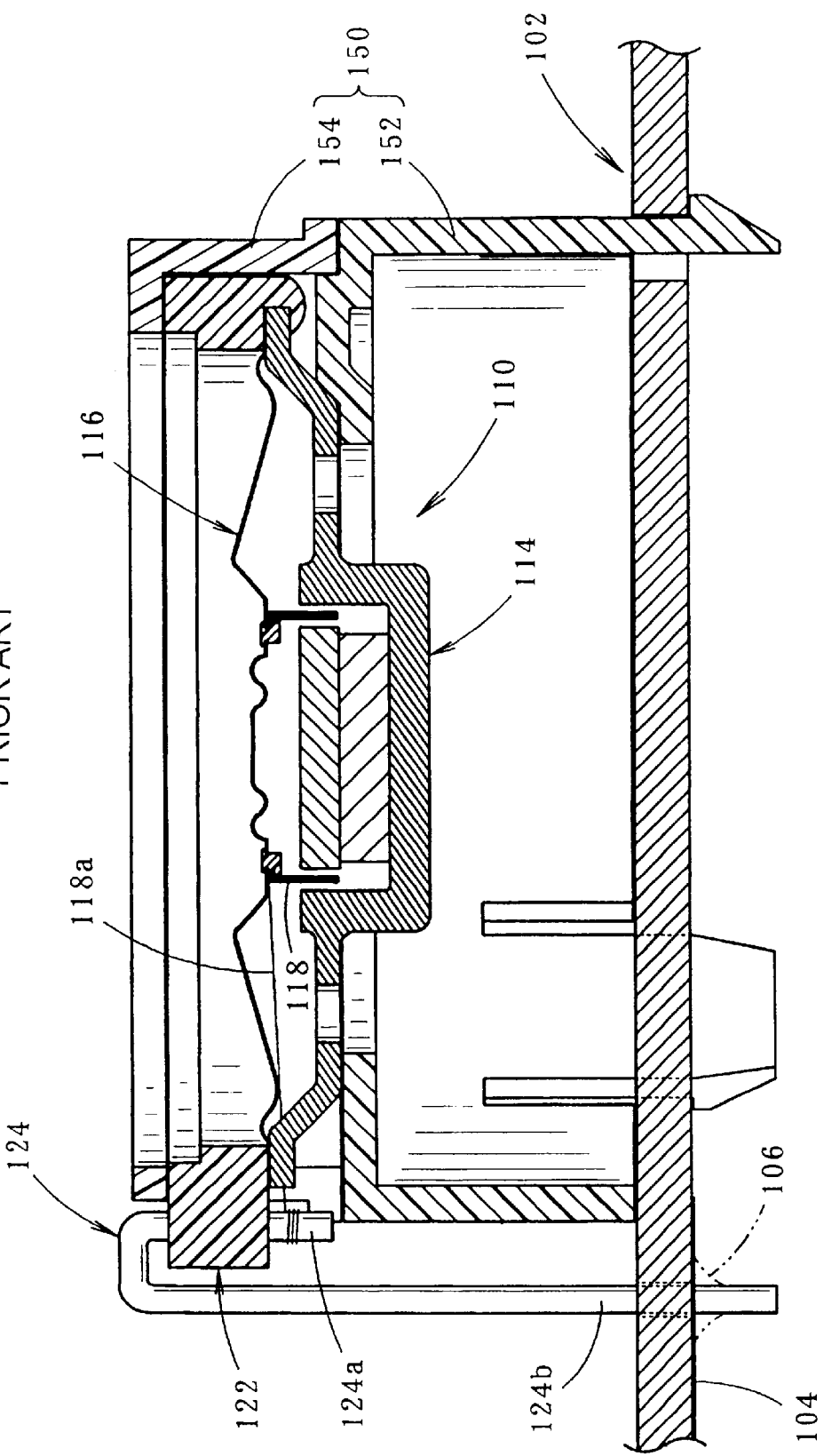
FIG. 8 is a side sectional view of a prior art.

As above described, the dimension "A" of the holder 50 is set a slightly smaller value than the sum ("B"+"t") of the dimension "B" of the speaker 10 and the dimension "t" of the printed circuit board 2. This allows each of the horizontal portions 54a to be maintained in a deflected posture (slightly bent forward) in state where each of the lance portions 54c is engaged with each of the engaging holes 2b. The double-dash line shows the position of the horizontal portion 54a before deflection in FIG. 7. The deflection of the horizontal portion 54a causes the speaker engagement portion 52 to constantly exert elastic pressure on the speaker 10, as shown by the downward arrows in FIG. 7. The speaker 10 is thereby pressed against the printed circuit board 2, assuring contact between the insulating ring 22 of the speaker 10 and the back surface 2e of the printed circuit board 2.

When the holder 50 retaining the speaker 10 is mounted on the printed circuit board 2, the two dummy legs 56 facilitate the operation. If there is no dummy leg, it would be difficult for the operator to allow the backward defection of the horizontal portion 54a and also to restore the position thereof since there is no hold for fingers other than the horizontal portion 54a. The dummy legs 56 provide a hold for fingers so as to facilitate the mounting operation.

After the speaker 10 is mounted and fixed on the printed circuit board 2 via the holder 50, each of the conducting portions 24b of the terminal pins 24 is soldered, as shown by the double-dash line in FIG. 2, thereby each of the terminal pins 24 is electrically connected with the conductor 4 of the printed circuit board 2.

As above described, the speaker holder 50 of the present invention comprises the speaker engagement portion 52 abutting the bottomed cylindrical portion 26A of the frame 26 of the speaker 10 and the engagement legs 54 extending from the speaker engagement portion 52. The speaker 10 is put tightly between the speaker engagement portion 52 and the printed circuit board 2 and fixed thereto via the engagement legs 54. This structure has the following advantages.

Compared with the conventional speaker holder having separate independent structures for retaining the speaker and for fixing the holder to the printed circuit board 2, the mounting height of the holder 50 when the speaker 10 is fixed on the printed circuit board 2 via the holder 50 is considerably lowered. Further, the holder 50 is simple in design since a structure for retaining a speaker is not required in this invention.

Since the holder 50 has the three engagement legs 54 radially extending from the speaker engagement portion 52, the speaker 10 is firmly fixed on the printed circuit board 2.

Since the holder 50 has the two dummy legs 56 also radially extending from the speaker engagement portion 52, the mounting operation is facilitated. When the speaker 10 is mounted on the printed circuit board 2 via the holder 50, the dummy legs 56 provide a hold for fingers to allow the backward deflection of the horizontal portion 54a and also to restore the posture thereof.

Since the holder 50 is fixed to the printed circuit board 2 by engagement of the lance portions 54c of the engagement legs 54 with the engaging holes 2b of the printed circuit board 2, the mounting operation of the speaker 10 is facilitated.

Since the holder 50 (the speaker engagement portion 52 thereof) constantly exerts elastic pressure on the speaker 10 by deflection of the engagement legs 54 in state where the speaker is mounted on the printed circuit board 2, the speaker 10 is firmly secured thereto.

Since the holder 50 (the speaker engagement portion 52 thereof) abuts the speaker 10 (the bottomed cylindrical portion 26A of the frame 26) to define the position thereof in the radial direction, the speaker 10 is easily and precisely positioned radially on the printed circuit board 2. Further, the annular flat surface 22a of the insulating ring 22 is brought into a close contact with the back surface 2e of the printed circuit board 2.

Since the positioning pin 58 is provided on one of the engagement legs 54 so as to engage with the sound emitting hole 26a of the speaker 10, the speaker 10 is easily and precisely positioned circumferentially on the printed circuit board 2.

The positioning pin 58 may be provided on any other of the engagement legs 54 according to the arrangement of the sound emitting holes 26a.

What is claimed is:

1. A speaker holder for a speaker to be mounted on a printed circuit board, the speaker having a bottomed cylindrical portion in a back surface thereof, the speaker holder comprising:
   a speaker engagement portion having a bottom portion and a cylindrical portion extending from the bottom portion; and
   at least one leg extending from the speaker engagement portion;
   wherein the speaker engagement portion is engaged with a back surface of the bottomed cylindrical portion; and
   the speaker is fixed on the printed circuit board via the at least one leg of the speaker holder with the speaker positioned tightly between the speaker engagement portion and the printed circuit board.

2. The speaker holder as claimed in claim 1, wherein the at least one leg comprises a plurality of legs radially extending from the speaker engagement portion.

3. The speaker holder as claimed in claim 1, wherein an end portion of the leg is engaged with an engaging hole formed in the printed circuit board.

4. The speaker holder as claimed in claim 2, wherein an end portion of the leg is engaged with an engaging hole formed in the printed circuit board.

5. The speaker holder as claimed in claim 1, wherein the leg is deflected in a state where the speaker is mounted on the printed circuit board so that the speaker engagement portion exerts elastic pressure on the speaker.

6. The speaker holder as claimed in claim 2, wherein the leg is deflected in a state where the speaker is mounted on the printed circuit board so that the speaker engagement portion exerts elastic pressure on the speaker.

7. The speaker holder as claimed in claim 1, wherein the speaker engagement portion is adapted to fit into the back surface of the speaker to radially position the speaker.

8. The speaker holder as claimed in claim 2, wherein the speaker engagement portion is adapted to fit into the back surface of the speaker to radially position the speaker.

9. The speaker holder as claimed in claim 1, the leg has a positioning portion adapted to engage with the speaker to circumferentially position the speaker.

10. The speaker holder as claimed in claim 2, the leg has a positioning portion adapted to engage with the speaker to circumferentially position the speaker.

11. A speaker holder for a speaker to be mounted on a printed circuit comprising:
    a speaker engagement portion abutting the back surface of the speaker; and
    at least one leg extending from the speaker engagement portion;
    wherein the speaker is fixed on the printed circuit board via the at least one leg of the speaker holder with the speaker positioned tightly between the speaker engagement portion and the printed circuit board,
    wherein the at least one leg comprises a plurality of legs radially extending from the speaker engagement portion and wherein the leg has a positioning portion adapted to engage with the speaker to circumferentially position the speaker,
    the positioning portion comprising a positioning pin adapted to be inserted into a sound emitting hole formed in the speaker.

12. The speaker holder as claimed in claim 1, wherein the printed circuit board has an opening, and the speaker is fixed by the speaker holder so that the opening opposes a diaphragm of the speaker.

* * * * *